United States Patent
Tsai et al.

(10) Patent No.: US 8,659,045 B2
(45) Date of Patent: Feb. 25, 2014

(54) LIGHT EMITTING DEVICE AND METHODS FOR FORMING THE SAME

(75) Inventors: Tzong-Liang Tsai, Hsinchu (TW); Yu-Chu Li, Taichung (TW); Chiung-Chi Tsai, Tanzi Shiang (TW)

(73) Assignee: Huga Optotech Inc., Taichung (TW)

( * ) Notice: Subject to any disclaimer, the term of this patent is extended or adjusted under 35 U.S.C. 154(b) by 0 days.

(21) Appl. No.: 11/848,458

(22) Filed: Aug. 31, 2007

(65) Prior Publication Data
US 2008/0054289 A1 Mar. 6, 2008

(30) Foreign Application Priority Data

Sep. 4, 2006 (TW) .............................. 95132634 A

(51) Int. Cl.
*H01L 33/00* (2010.01)
(52) U.S. Cl.
USPC .................. 257/99; 438/29; 257/E33.001
(58) Field of Classification Search
USPC ............................................................ 257/99
See application file for complete search history.

(56) References Cited

U.S. PATENT DOCUMENTS

| | | | | |
|---|---|---|---|---|
| 6,693,352 B1 * | 2/2004 | Huang et al. | ................... | 257/743 |
| 6,861,305 B2 * | 3/2005 | Koike et al. | ................... | 438/200 |
| 7,180,094 B2 * | 2/2007 | Seong et al. | ................... | 257/59 |
| 7,180,097 B2 * | 2/2007 | Wu et al. | ................... | 257/79 |
| 2003/0122147 A1 * | 7/2003 | Sheu | ................... | 257/103 |
| 2005/0022725 A1 * | 2/2005 | Jurgensen et al. | ................... | 117/104 |
| 2005/0087884 A1 * | 4/2005 | Stokes et al. | ................... | 257/778 |
| 2005/0269583 A1 * | 12/2005 | Kim et al. | ................... | 257/94 |
| 2005/0269588 A1 * | 12/2005 | Kim et al. | ................... | 257/99 |
| 2006/0038193 A1 * | 2/2006 | Wu et al. | ................... | 257/98 |
| 2006/0145179 A1 * | 7/2006 | Wu et al. | ................... | 257/99 |

OTHER PUBLICATIONS

Merriam-Webster Collegiate Dictionary 10th Edition © 1997, p. 828—"over".*

* cited by examiner

*Primary Examiner* — Mark Tornow
(74) *Attorney, Agent, or Firm* — Muncy, Geissler, Olds & Lowe, PLLC

(57) ABSTRACT

The present invention provides a light emitting device, which includes a transparent substrate, an epitaxial stack structure having a first portion and a second portion on the transparent substrate, a II/V group compound contact layer on the first portion of the epitaxial stack structure, a nitride-crystallized layer on the II/V group compound contact layer, a transparent conductive layer covering the nitride-crystallized layer, a first electrode on a portion of the transparent conductive layer, and a second electrode on the second portion of the epitaxial stack structure and structurally separated from the structure on the first portion of the epitaxial stack structure. The nitride-crystallized layer may help increase the external quantum efficiency of the light emitting device, thereby the light emitting efficiency of the light emitting device may also be improved.

6 Claims, 7 Drawing Sheets

LIGHT EMITTING DEVICE AND METHODS FOR FORMING THE SAME

CROSS-REFERENCE TO RELATED APPLICATIONS

This application claims the right of priority based on Taiwan Patent Application No. 95132634 entitled "LIGHT EMITTING DEVICE AND METHODS FOR FORMING THE SAME," filed on Sep. 4, 2006, which is incorporated herein by reference and assigned to the assignee herein.

TECHNICAL FIELD

The present invention relates to a light emitting device, and more particularly to a light emitting device taking a II/V group compound contact layer as the ohmic contact layer, and having an epitaxially grown nitride-crystallized layer of a specific structure on the II/V group compound contact layer. Thereby the light from the active layer may be more efficiently outputted, and thus the light emitting efficiency of the light emitting device is improved.

BACKGROUND OF THE INVENTION

In FIG. 1, the epitaxially grown epitaxial layer on the substrate 100 includes a first compound semiconductor layer 110, an active layer 120 and a second compound semiconductor layer 130. The recombination of minority carriers may bring energy conversion when the current flows forward through the active layer 120 between the second compound semiconductor layer 130 and the first compound semiconductor layer 110, thereby the epitaxial layer is capable of emitting light. An ohmic contact layer 140 is on the epitaxial layer and serves to enhance the current diffusion and the contact between a first electrode 150 and the second compound semiconductor layer 130. A second electrode 160 on the first compound semiconductor layer 110 forms a current loop with the first electrode 150, the ohmic contact layer 140, the second compound semiconductor layer 130, the active layer 120, and the first compound semiconductor layer 110.

The light emitted from the epitaxial layer due to the energy conversion may go through the ohmic contact layer 140, and the light intensity may be reduced, since the ohmic contact layer 140 may block a portion of the light. Therefore, a light emitting device with improved light intensity is needed.

SUMMARY OF THE INVENTION

The object of this invention is to replace the conventional ohmic contact layer with a II/V group compound contact layer and employ a nitride-crystallized layer easily being grown on the II/V group compound contact layer. Thus the light intensity resulted from the light emitting area may be increased, and the light emitting efficiency of the light emitting device is improved.

The present invention provides a light emitting device, which includes a transparent substrate, an epitaxial stack structure having a first portion and a second portion on the transparent substrate, a II/V group compound contact layer on the first portion of the epitaxial stack structure, a nitride-crystallized layer on the II/V group compound contact layer, a transparent conductive layer covering the nitride-crystallized layer, a first electrode on the transparent conductive layer, and a second electrode on the second portion of the epitaxial stack structure and structurally separated from the structure on the first portion of the epitaxial stack structure.

The nitride-crystallized layer may help increase the external quantum efficiency of the light emitting device, thereby the light emitting efficiency of the light emitting device may also be improved.

The object, embodiments, features and advantages will become more apparent when referring to the description of the preferred embodiments and the drawings.

DETAILED DESCRIPTION OF THE PREFERRED EMBODIMENTS

Some embodiments of the present invention are described in detail below. However, the present invention may be implemented in other embodiments in addition to those which are described herein. And the scope of the present invention is not limited to the description, but should be construed according to the appended claims.

Figure 1:
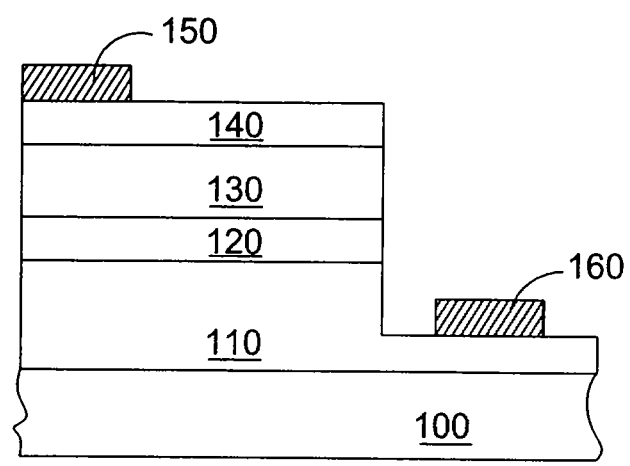
FIG. 1 is a cross-sectional view of a light emitting diode according to the prior art.
Figure 2A:
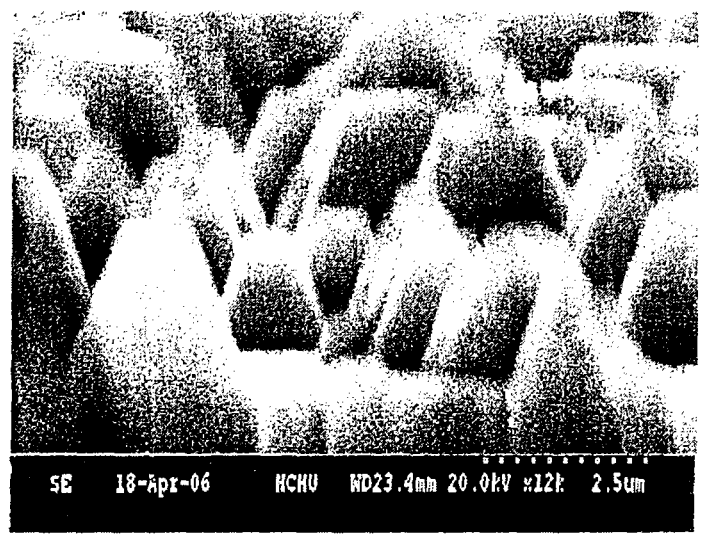
FIG. 2A shows a picture of a crystallized layer of a protrusion type structure according to the present invention taken by a scanning electron microscope.
Figure 2B:
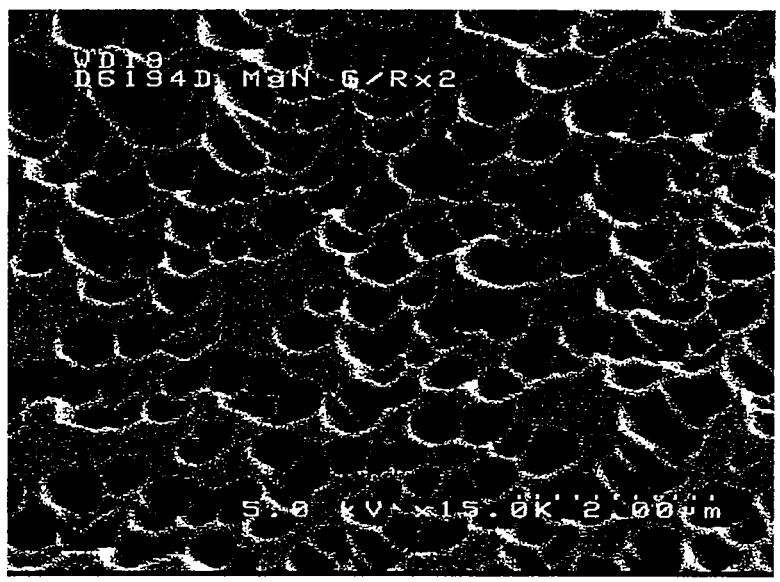
FIG. 2B shows a picture of a crystallized layer of a recess type structure according to the present invention taken by a scanning electron microscope.

First referring to FIGS. 2A and 2B, the pictures of nitride-crystallized layers of a protrusion type structure and a recess type structure taken by a scanning electron microscope are respectively shown.

Figure 3A:
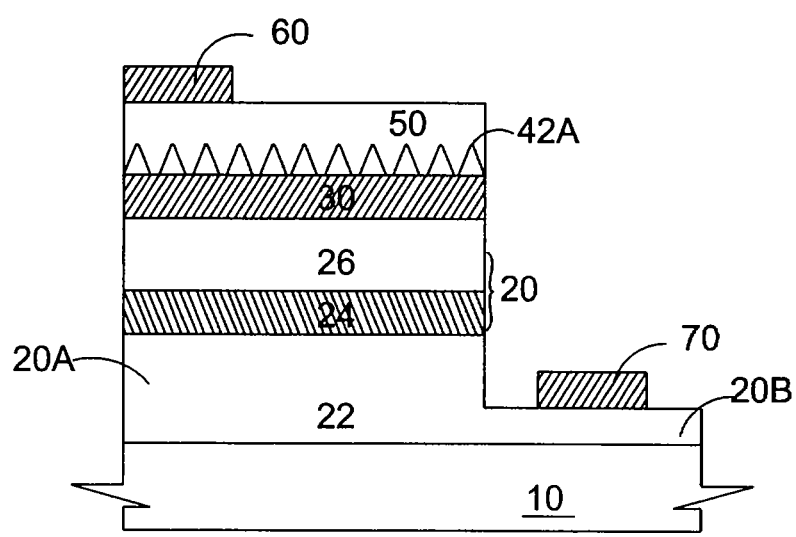
FIG. 3A is a cross-sectional view of a light emitting device having a II/V group compound contact layer and a nitride nucleus layer of a protrusion type according to the present invention.

Then referring to FIG. 3A, a schematic diagram of a light emitting device according to the present invention is shown. The light emitting device includes a substrate 10, an epitaxial stack structure 20 having a first portion 20A and a second portion 20B over the substrate 10, a II/V group compound contact layer 30 on the first portion 20A of the epitaxial stack structure 20, and a nitride-crystallized layer 42A on the II/V group compound contact layer 30. The nitride-crystallized layer 42A may be of a protrusion type structure (as shown in FIG. 2A) or a recess type structure (as shown in FIG. 2B).

Still referring to FIG. 3A, the light emitting device disclosed in the present invention further includes a transparent conductive layer 50 covering the nitride-crystallized layer 42A, a first electrode 60 of a first conductive type on a portion of the transparent conductive layer 50, and a second electrode 70 of a second conductive type on the second portion 20B of the epitaxial stack structure 20. The substrate 10 may be a transparent substrate or a sapphire substrate generally employed in the light emitting devices. The epitaxial stack structure 20 further includes a first semiconductor layer 22 of a first conductive type on the substrate 10, an active layer 24 on the first semiconductor layer 22 of the first conductive type, and a second semiconductor layer 26 of a second conductive type on the active layer 24. Here the first semiconductor layer 22 may be made of GaN or a semiconductor layer including GaN-related compounds. The active layer 24 may include quantum well or multi-quantum well and may be made of GaN or a semiconductor layer including GaN-related compounds. The first semiconductor layer 22 and the second semiconductor layer 26 are of opposite conductive types, and may be n-type and p-type GaN semiconductor layers, respectively. Besides, the first conductive type of the first electrode 60 is opposite to the second conductive type of the second electrode 70.

Furthermore, the first electrode 60 is structurally separated from the structure over the first portion 20A of the epitaxial stack structure 20. In this embodiment, a II/V group compound contact layer 30 is employed to eliminate the difficulty of forming p-type ohmic contact layer. Besides, the formation of the ohmic contact and the external quantum efficiency of the light emitting devices could be improved by the nitride-crystallized layer of 3-dimensional specific structure 42A or 42B epitaxially grown on the II/V group compound contact layer 30.

Again referring to FIGS. 3A and 3B, the present invention further provides a method of forming the light emitting device including the following steps. A substrate 10 is provided. An epitaxial stack structure 20 is epitaxially grown on the substrate 10, wherein the epitaxial stack structure 20 has a first portion 20A and a second portion 20B. Here the method for forming the epitaxial stack structure 20 may include epitaxially growing a first semiconductor layer 22 of a first conductive type on the substrate 10, forming an active layer 24 on the first semiconductor layer 22, and forming a second semiconductor layer 26 of a second conductive type on the active layer 24.

Next, a II/V group compound contact layer 30 is formed on the first portion 20A of the epitaxial stack structure 20. Here the II group elements of the II/V group compound contact layer 30 may include Zn, Be, Mg, Ca, Sr, Ba, Ra. The V group elements of the II/V group compound contact layer 30 may include N, P, As, Sb Bi. The II group and V group elements mentioned above may be arbitrarily compounded to form the II/V group compound contact layer 30 implemented in the present invention. In this embodiment, the II/V group compound contact layer 30 may be made of $Mg_xN_y$. The $Mg_xN_y$ may be formed by metal organic chemical vapor deposition (MOCVD) with a precursor containing magnesium, such as $DCp_2Mg$(bis(cyclopentadienyl)Magnesium) or Bis(methylcyclopentadienyl)Magnesium, reacting with introduced $NH_3$ in the reaction chamber. Here the II/V group compound contact layer 30 may be a $Mg_xN_y$ layer formed on the epitaxial stack structure 20 with a thickness of about 75 Å and a roughness smaller than about 10 nm, and preferably, about 2 nm. The II/V group compounds can be grown on the epitaxial stack structure 20, especially on p-type compounds, and have a band-gap energy smaller than the conventional III/V group compounds. Several examples of the band-gap energy of the II/V group compounds may be as follows: 0.93 eV for $Zn_3As_2$, 3.2 eV for $Zn_nN$, 1.57 eV for $Zn_3P_3$ and 2.8 eV for $Mg_3N_2$. However, the GaN as conventional III/V group compound contact layer has a band-gap energy of about 3.34 eV. Therefore, due to the smaller band-gap energy, the II/V group compound contact layer 30 would provide a good ohmic contact and thus a suitable ohmic electrode.

Figure 3B:
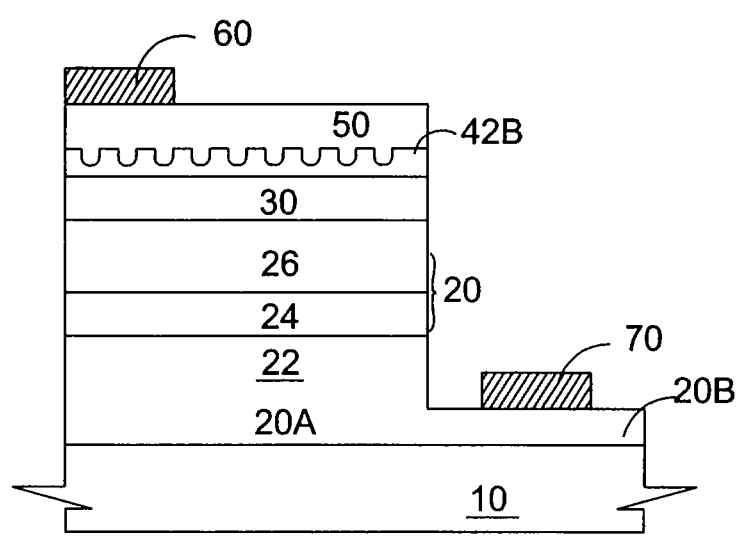
FIG. 3B is a cross-sectional view of a light emitting device having a II/V group compound contact layer and a nitride nucleus layer of a recess type according to the present invention.

Afterward, the nitride-crystallized layer 42A and 42B of 3-dimensional specific structure are epitaxially grown on the II/V group compound contact layer 30. The brightness of light from the active layer (or active area) 24 and thus the light emitting efficiency could be improved through the 3-dimensional specific structure. The nitride-crystallized layer 42A of a protrusion type structure (as shown in FIG. 3A) or the nitride-crystallized layer 42B of a recess type structure (as shown in FIG. 3B) on the II/V group compound contact layer 30 may be obtained by controlling the conditions of epitaxial growth, such as growth temperature, growth pressure or molar ratio of V group to III group elements. For example, the nitride-crystallized layer 42A of the protrusion type structure (as shown in FIG. 2A) may be formed under temperature of about 800 to 1000° C., pressure of about 76 to 700 torr, and a molar ratio of V group to III group elements as about 500:1000. The nitride-crystallized layer 42B of the recess type structure (as shown in FIG. 2B) may be formed under temperature of about 600 to 900° C., pressure of about 76 to 700 torr, and a molar ratio of V group to III group elements as about 500:1000.

Next, a transparent conductive layer 50 is formed on the nitride-crystallized layer of the protrusion type structure 42A or the recess type structure 42B. The transparent conductive layer 50 may be made of ITO, ZnO, Ni/Au alloy, CTO, TiWN, $In_2O_3$, $SnO_2$, CdO, ZnO, $CuGaO_2$ or $SrCu_2O_2$. Finally, a first electrode 60 is formed on a portion of the transparent conductive layer 50 to form the ohmic contact, and a second electrode 70 is formed on the second portion 20B of the epitaxial stack structure 20. Please note that the second electrode 70 may be formed after the epitaxial layers 22, 24, 26 are etched to expose a portion of the first semiconductor layer 22.

Figure 4A:
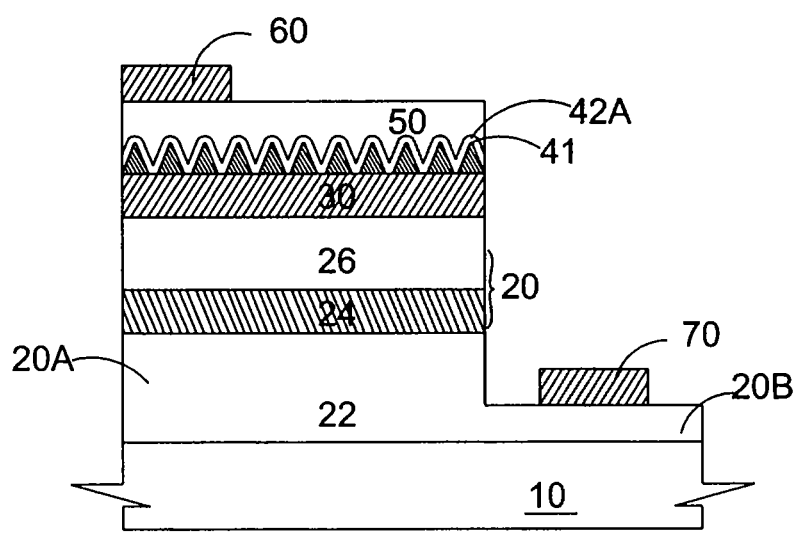
FIG. 4A is a cross-sectional view of a light emitting device having a nitride nucleus layer and a nitride-crystallized layer of a protrusion type according to the present invention.
Figure 4B:
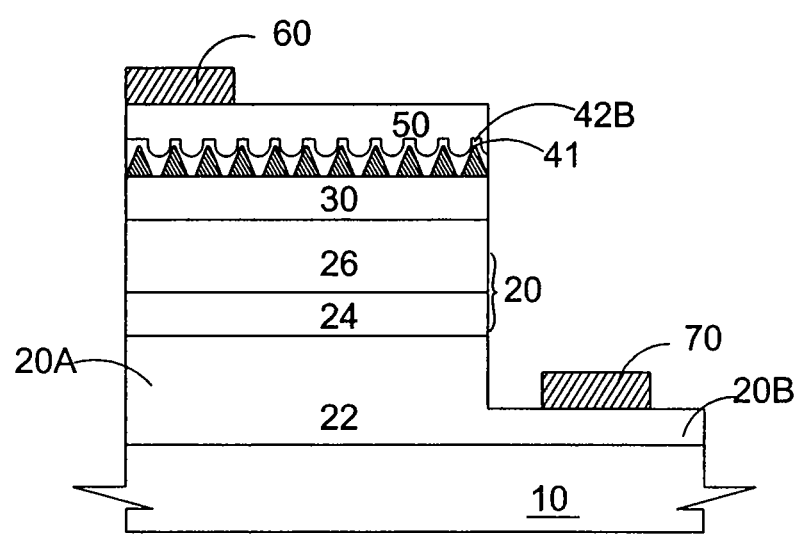
FIG. 4B is a cross-sectional view of a light emitting device having a nitride nucleus layer and a nitride-crystallized layer of a recess type according to the present invention.

Referring to FIGS. 4A and 4B, another preferred embodiment of the light emitting device disclosed by the present invention is shown. The substrate 10, the epitaxial stack structure 20, the II/V group compound contact layer 30, the transparent conductive layer 50, the first electrode 60 and the second electrode 70 disclosed in FIGS. 4A and 4B have similar structures and functions to those shown in FIGS. 3A and 3B, and will not be elaborated on herein.

As shown in FIG. 4A, the light emitting device includes a substrate 10, an epitaxial stack structure 20 having a first portion 20A and a second portion 20B on the substrate 10, a II/V group compound contact layer 30 on the first portion 20A of the epitaxial stack structure 20, a nitride nucleus layer 41 on the II/V group compound contact layer 30, a nitride-crystallized layer 42A of a protrusion type structure on the nitride nucleus layer 41 and a transparent conductive layer 50 covering the nitride-crystallized layer 42A and the nitride nucleus layer 41. The light emitting device shown in FIG. 4B is similar, except the nitride-crystallized layer 42B is of a recess type structure.

Besides, the light emitting device may further include a first electrode 60 of a first conductive type on the transparent conductive layer 50, and a second electrode 70 of a second conductive type on the second portion 20B of the epitaxial stack structure 20. The first and second conductive types are opposite to each other. The second electrode 70 is structurally separated from the structure on the first portion 20A of the epitaxial stack structure 20. It should be noted that, the epitaxial stack structure 20 bottom-up includes: a first semiconductor layer 22 of a first conductive type on the substrate 10, an active layer 24 on the first semiconductor layer 22, and a second semiconductor layer 26 of a second conductive type on the active layer 24. Here the first semiconductor layer 22 and the second semiconductor layer 26 are of opposite conductive types.

Furthermore, the present invention provides a method of forming light emitting device including the following steps. A substrate 10 is provided. An epitaxial stack structure 20 is epitaxially grown on the substrate 10, wherein the epitaxial stack structure 20 has a first portion 20A and a second portion 20B. Here the method for forming the epitaxial stack structure 20 may include forming a first semiconductor layer 22 of a first conductive type on the substrate 10, forming an active layer 24 on the first semiconductor layer 22, and forming a second semiconductor layer 26 of a second conductive type on the active layer 24. The epitaxial layers 22, 24, 26 may be etched to expose a portion of the first semiconductor layer 22; thus the first portion 20A and the second portion 20B are formed. Next, a II/V group compound contact layer 30 is formed on the first portion 20A of the epitaxial stack structure 20.

Afterward, a nitride nucleus layer 41, easy to form on the II/V group compound contact layer 30, is epitaxially grown on the II/V group compound contact layer 30. Then taking the nitride nucleus layer 41 as a seed layer, a nitride-crystallized layer 42A of a protrusion type structure (as shown in FIG. 4A) or a nitride-crystallized layer 42B of a recess type structure (as shown in FIG. 4B) is epitaxially grown on the II/V group compound contact layer 30. The brightness of light from the active layer (or active area) 24 and thus the light emitting efficiency could be improved using either the nitride-crystallized layer of the protrusion type structure 42A or the nitride-crystallized layer of the recess type structure 42B. It should be noted that, the nitride nucleus layer 41 may be made of the same materials as the nitride-crystallized layer 42A or 42B, which could be a semiconductor including III group compounds, such as quaternary compound AlInGaN or ternary compound p-InGaN. Further, a transparent conductive layer 50 is formed to cover the nitride-crystallized layer 42A or 42B and the nitride nucleus layer 41.

Moreover, the method of forming light emitting device may further include: forming a first electrode 60 of a first conductive type on a portion of the transparent conductive layer 50 to form ohmic contact, and forming a second electrode 70 of a second conductive type on the second portion 20B of the epitaxial stack structure 20. The second electrode 70 is structurally separated from the structure on the first portion 20A of the epitaxial stack structure 20. Besides, the first electrode 60 and the second electrode 70 are of opposite conductive types.

According to the above descriptions, the II/V group compound contact layer 30 of the present invention takes the place of the conventional p-type semiconductor layer being the ohmic contact layer. Additionally, since a III group nitride nucleus layer 41 is easy to form on the II/V group compound contact layer 30, a V/III/II group compound crystallized layer could be formed on the II/V group compound contact layer 30.

Furthermore, taking the nitride nucleus layer 41 as the seed layer, the nitride-crystallized layer 42A or 42B of the specific structure is epitaxially grown. The brightness of light from the active layer 24 and thus the light emitting efficiency of the light emitting device could be improved through the protrusion or recess type structures of the nitride-crystallized layer 42A or 42B.

The above description is only for preferred embodiments, but not to limit the scope of the present invention. Any other equivalent changes or modifications performed with the spirit disclosed by the present disclosure should be included in the appended claims.

We claim:

1. A light emitting device, comprising:
    a substrate;
    an epitaxial stack structure on said substrate, said epitaxial stack structure having a first portion and a second portion, wherein said epitaxial stack structure bottom-up comprises a first semiconductor layer of a first conductive type, an active layer and a second semiconductor layer of a second conductive type;
    a II/V group compound contact layer directly formed on said second semiconductor layer, wherein said second semiconductor layer is situated in said first portion of said epitaxial stack structure;
    a crystallized layer of a protrusion or recess type structure directly on top of said II/V group compound contact layer;
    a conductive layer covering said crystallized layer of a protrusion or recess type structure;
    a first electrode on said conductive layer; and
    a second electrode on said second portion of said epitaxial stack structure, wherein said second electrode is structurally separated from the structure on said first portion of said epitaxial stack structure and is of opposite conductive type to said first electrode.

2. The light emitting device according to claim 1, wherein said II/V group compound contact layer is made of $Mg_xN_y$.

3. The light emitting device according to claim 1, wherein said crystallized layer of said a protrusion or recess type structure is epitaxially grown.

4. The light emitting device according to claim 1, wherein the material of said conductive layer is selected from a group consisted of ITO, ZnO Ni/Au alloy, CTO, TiWN, $In_2O_3$, $SnO_2$, CdO, ZnO, $CuGaO_2$ and $SrCu_2O_2$.

5. The light emitting device according to claim 1, further comprising:
    a nitride nucleus layer on said II/V group compound contact layer;
    wherein said crystallized layer of a protrusion or recess type structure is on said nitride nucleus layer and said conductive layer further covers said nitride nucleus layer.

6. The light emitting device according to claim 5, wherein the method of forming said nitride nucleus layer comprises an epitaxial growth.

* * * * *